(12) United States Patent
Bradshaw et al.

(10) Patent No.: US 11,416,422 B2
(45) Date of Patent: Aug. 16, 2022

(54) MEMORY CHIP HAVING AN INTEGRATED DATA MOVER

(71) Applicant: Micron Technology, Inc., Boise, ID (US)

(72) Inventors: Samuel E. Bradshaw, Sacramento, CA (US); Shivam Swami, Folsom, CA (US); Sean S. Eilert, Penryn, CA (US); Justin M. Eno, El Dorado Hills, CA (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/573,780

(22) Filed: Sep. 17, 2019

(65) Prior Publication Data

US 2021/0081336 A1 Mar. 18, 2021

(51) Int. Cl.
| | |
|---|---|
| *G06K 7/08* | (2006.01) |
| *G06K 19/06* | (2006.01) |
| *G06F 13/10* | (2006.01) |
| *G06F 3/06* | (2006.01) |
| *G06F 13/12* | (2006.01) |
| *G06F 12/0802* | (2016.01) |

(52) U.S. Cl.
CPC .............. *G06F 13/102* (2013.01); *G06F 3/06* (2013.01); *G06F 12/0802* (2013.01); *G06F 13/124* (2013.01); *G06F 2212/621* (2013.01)

(58) Field of Classification Search
CPC .. G06F 12/0811; G06F 12/0804; G06F 12/08; G06F 12/0802; G06F 13/102; G06F 13/124; G06F 3/06; G06F 2212/621

USPC .................................................. 235/492, 451
See application file for complete search history.

(56) References Cited

U.S. PATENT DOCUMENTS

| | | | |
|---|---|---|---|
| 6,928,512 | B2 | 8/2005 | Ayukawa et al. |
| 7,627,744 | B2 | 12/2009 | Maher et al. |
| 9,195,602 | B2 | 11/2015 | Hampel et al. |
| 9,760,497 | B2 | 9/2017 | Nakajima et al. |
| 10,114,558 | B2 | 10/2018 | Miller et al. |
| 11,074,042 | B2 | 7/2021 | Howard et al. |
| 11,163,490 | B2 | 11/2021 | Curewitz et al. |

(Continued)

FOREIGN PATENT DOCUMENTS

WO 2015101827 7/2015

OTHER PUBLICATIONS

International Search Report and Written Opinion, PCT/US2020/049938, dated Dec. 21, 2020.

(Continued)

*Primary Examiner* — Tuyen K Vo
(74) *Attorney, Agent, or Firm* — Greenberg Traurig

(57) ABSTRACT

A memory chip having a first set of pins configured to allow the memory chip to be coupled to a first microchip or device via first wiring. The memory chip also having a second set of pins configured to allow the memory chip to be coupled to a second microchip or device via second wiring that is separate from the first wiring. The memory chip also having a data mover configured to facilitate access to the second microchip or device, via the second set of pins, to read data from the second microchip or device and write data to the second microchip or device. Also, a system having the memory chip, the first microchip or device, and the second microchip or device.

20 Claims, 8 Drawing Sheets

(56) References Cited

U.S. PATENT DOCUMENTS

| | | |
|---|---|---|
| 2003/0023958 A1 | 1/2003 | Patel et al. |
| 2003/0212845 A1* | 11/2003 | Court .................... G06F 13/387 |
| | | 710/305 |
| 2005/0075154 A1 | 4/2005 | Bordes et al. |
| 2005/0075849 A1 | 4/2005 | Maher et al. |
| 2005/0086040 A1 | 4/2005 | Davis et al. |
| 2005/0135353 A1 | 6/2005 | Chandra et al. |
| 2005/0135367 A1 | 6/2005 | Chandra et al. |
| 2005/0189426 A1* | 9/2005 | Nishizawa ....... G06K 19/07732 |
| | | 235/492 |
| 2005/0273570 A1* | 12/2005 | DeSouter ............ G06F 12/1045 |
| | | 711/203 |
| 2006/0156074 A1* | 7/2006 | Kumar ................ G06F 11/3648 |
| | | 714/51 |
| 2009/0022077 A1* | 1/2009 | Lin ........................ H04L 49/90 |
| | | 370/310 |
| 2009/0063786 A1 | 3/2009 | Oh |
| 2009/0113078 A1 | 4/2009 | Schnell et al. |
| 2010/0030951 A1 | 2/2010 | Kim |
| 2010/0217977 A1 | 8/2010 | Goodwill et al. |
| 2011/0087834 A1* | 4/2011 | Tremaine ............ G06F 12/0638 |
| | | 711/105 |
| 2011/0161555 A1 | 6/2011 | Olds et al. |
| 2012/0054422 A1 | 3/2012 | Gu et al. |
| 2013/0019131 A1 | 1/2013 | Tetzlaff et al. |
| 2013/0191854 A1 | 7/2013 | Zievers |
| 2013/0194286 A1 | 8/2013 | Bourd et al. |
| 2014/0281121 A1* | 9/2014 | Karamcheti ......... G06F 9/4881 |
| | | 711/102 |
| 2014/0359219 A1 | 12/2014 | Evans et al. |
| 2015/0268875 A1 | 9/2015 | Jeddeloh |
| 2016/0054933 A1 | 2/2016 | Haghighi et al. |
| 2016/0062921 A1 | 3/2016 | Kim et al. |
| 2017/0017576 A1 | 1/2017 | Cammarota et al. |
| 2017/0212724 A1 | 7/2017 | Howard et al. |
| 2018/0107406 A1 | 4/2018 | O et al. |
| 2018/0260220 A1 | 9/2018 | Lacy et al. |
| 2018/0341588 A1 | 11/2018 | Ramanujan et al. |
| 2019/0042145 A1 | 2/2019 | Pham et al. |
| 2019/0057302 A1 | 2/2019 | Cho et al. |
| 2019/0057303 A1 | 2/2019 | Burger |
| 2019/0087708 A1 | 3/2019 | Goulding et al. |
| 2019/0146788 A1 | 5/2019 | Kim |
| 2019/0188386 A1 | 6/2019 | Pogorelik et al. |
| 2019/0272119 A1 | 9/2019 | Brewer |
| 2019/0273782 A1 | 9/2019 | Kulkarni et al. |
| 2019/0273785 A1 | 9/2019 | Liu et al. |
| 2019/0278518 A1 | 9/2019 | Byun et al. |
| 2019/0303300 A1 | 10/2019 | Boyd et al. |
| 2019/0347559 A1 | 11/2019 | Kang et al. |
| 2019/0354842 A1 | 11/2019 | Louizos et al. |
| 2020/0050385 A1 | 2/2020 | Furey et al. |
| 2021/0081141 A1 | 3/2021 | Curewitz et al. |
| 2021/0081318 A1 | 3/2021 | Akel et al. |
| 2021/0081337 A1 | 3/2021 | Eilert et al. |
| 2021/0081353 A1 | 3/2021 | Eno et al. |
| 2022/0050639 A1 | 2/2022 | Curewitz et al. |
| 2022/0050662 A1 | 2/2022 | Howard et al. |

OTHER PUBLICATIONS

International Search Report and Written Opinion, PCT/US2020/049942, dated Dec. 17, 2020.

International Search Report and Written Opinion, PCT/US2020/049940, dated Dec. 22, 2020.

Programmable Engine for Data Movement, U.S. Appl. No. 16/573,785, filed Sep. 17, 2019, Kenneth Curewitz et al., Patented Case, May 4, 2021.

Programmable Engine for Data Movement, U.S. Appl. No. 17/515,229, filed Oct. 29, 2021, Kenneth Curewitz et al., Docketed New Case—Ready for Examination, Nov. 13, 2021.

Flexible Provisioning of Multi-tier Memory, U.S. Appl. No. 16/573,791, filed Sep. 17, 2019, Ameen Akel et al., Final Rejection Mailed, Dec. 21, 2021.

Accelerator Chip Connecting a System on a Chip and a Memory Chip, U.S. Appl. No. 16/573,795, filed Sep. 17, 2019, Justin Eno et al., Docketed New Case—Ready for Examination, Feb. 19, 2020.

Memory Chip Connecting a System on a Chip and an Accelerator Chip, U.S. Appl. No. 16/573,805, filed Sep. 17, 2019, Sean Eilert et al., Notice of Allowance Mailed—Application Received in Office of Publications, May 6, 2021.

International Search Report and Written Opinion, PCT/US2020/050712, dated Dec. 21, 2020.

International Search Report and Written Opinion, PCT/US2020/050713, dated Dec. 21, 2020.

Mohsen Imani, et al. "RAPIDNN: In-Memory Deep Neural Network Acceleration Framework." arXiv: 1806.05794v4, Apr. 11, 2019.

* cited by examiner

MEMORY CHIP HAVING AN INTEGRATED DATA MOVER

FIELD OF THE TECHNOLOGY

At least some embodiments disclosed herein relate to a memory chip having an integrated data mover. Also, at least some embodiments disclosed herein relate to using such a memory chip in flexible provisioning of a string of memory chips to form a memory.

BACKGROUND

Memory of a computing system can be hierarchical. Often referred to as memory hierarchy in computer architecture, memory hierarchy can separate computer memory into a hierarchy based on certain factors such as response time, complexity, capacity, persistence and memory bandwidth. Such factors can be related and can often be tradeoffs which further emphasizes the usefulness of a memory hierarchy.

In general, memory hierarchy affects performance in a computer system. Prioritizing memory bandwidth and speed over other factors can require considering the restrictions of a memory hierarchy, such as response time, complexity, capacity, and persistence. To manage such prioritization, different types of memory chips can be combined to balance chips that are faster with chips that are more reliable or cost effective, etc. Each of the various chips can be viewed as part of a memory hierarchy. And, for example, to reduce latency on faster chips, other chips in a memory chip combination can respond by filling a buffer and then signaling for activating the transfer of data between chips.

Memory hierarchy can be made of up of chips with different types of memory units. For example, memory units can be dynamic random-access memory (DRAM) units. DRAM is a type of random access semiconductor memory that stores each bit of data in a memory cell, which usually includes a capacitor and a metal-oxide-semiconductor field-effect transistor (MOSFET). The capacitor can either be charged or discharged which represents the two values of a bit, "0" and "1". In DRAM, the electric charge on a capacitor leaks off, so DRAM requires an external memory refresh circuit which periodically rewrites the data in the capacitors by restoring the original charge per capacitor. On the other hand, with static random-access memory (SRAM) units a refresh feature is not needed. Also, DRAM is considered volatile memory since it loses its data rapidly when power is removed. This is different from flash memory and other types of non-volatile memory, such as non-volatile random-access memory (NVRAM), in which data storage is more persistent.

A type of NVRAM is 3D XPoint memory. With 3D XPoint memory, memory units store bits based on a change of bulk resistance in conjunction with a stackable cross-gridded data access array. 3D XPoint memory can be more cost effective than DRAM but less cost effective than flash memory.

Flash memory is another type of non-volatile memory. An advantage of flash memory is that is can be electrically erased and reprogrammed. Flash memory is considered to have two main types, NAND-type flash memory and NOR-type flash memory, which are named after the NAND and NOR logic gates that can implement the memory units of flash memory. The flash memory units or cells exhibit internal characteristics similar to those of the corresponding gates. A NAND-type flash memory includes NAND gates. A NOR-type flash memory includes NOR gates. NAND-type flash memory may be written and read in blocks which can be smaller than the entire device. NOR-type flash permits a single byte to be written to an erased location or read independently. Because of advantages of NAND-type flash memory, such memory has been often utilized for memory cards, USB flash drives, and solid-state drives. However, a primary tradeoff of using flash memory in general is that it is only capable of a relatively small number of write cycles in a specific block compared to other types of memory such as DRAM and NVRAM.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 5:
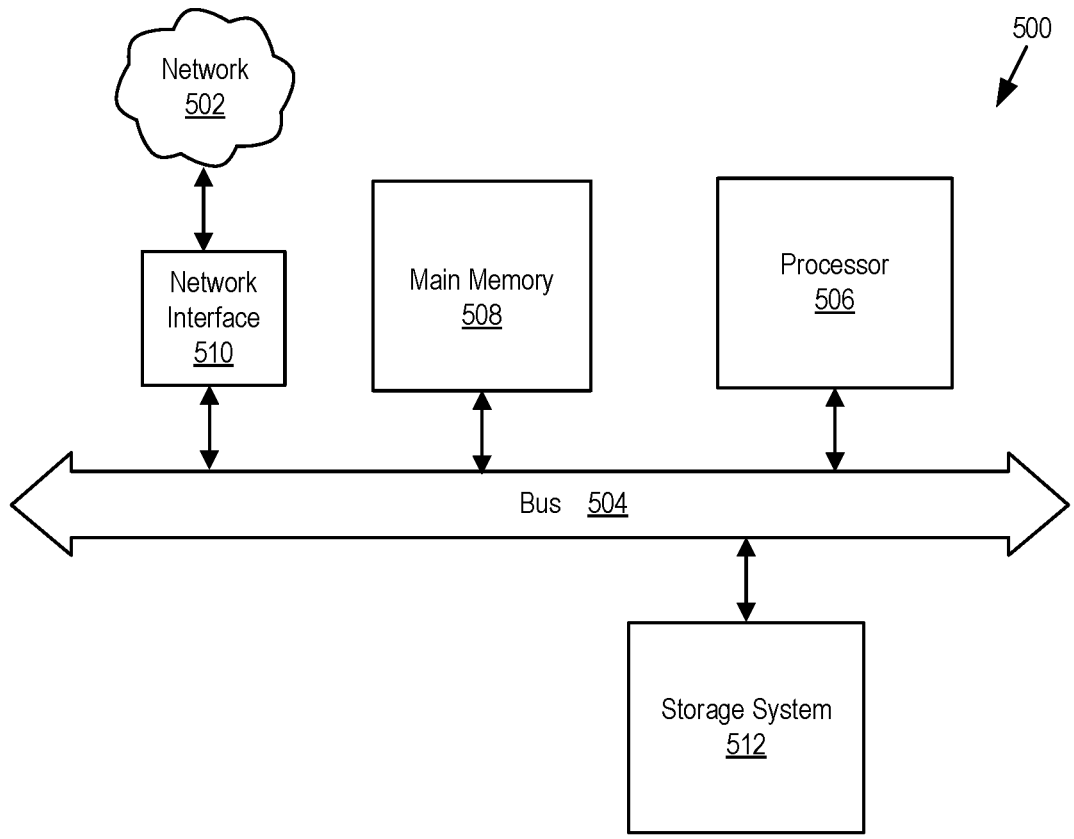
FIG. 5 illustrates example parts of an example computing device, in accordance with some embodiments of the present disclosure.
Figure 6:
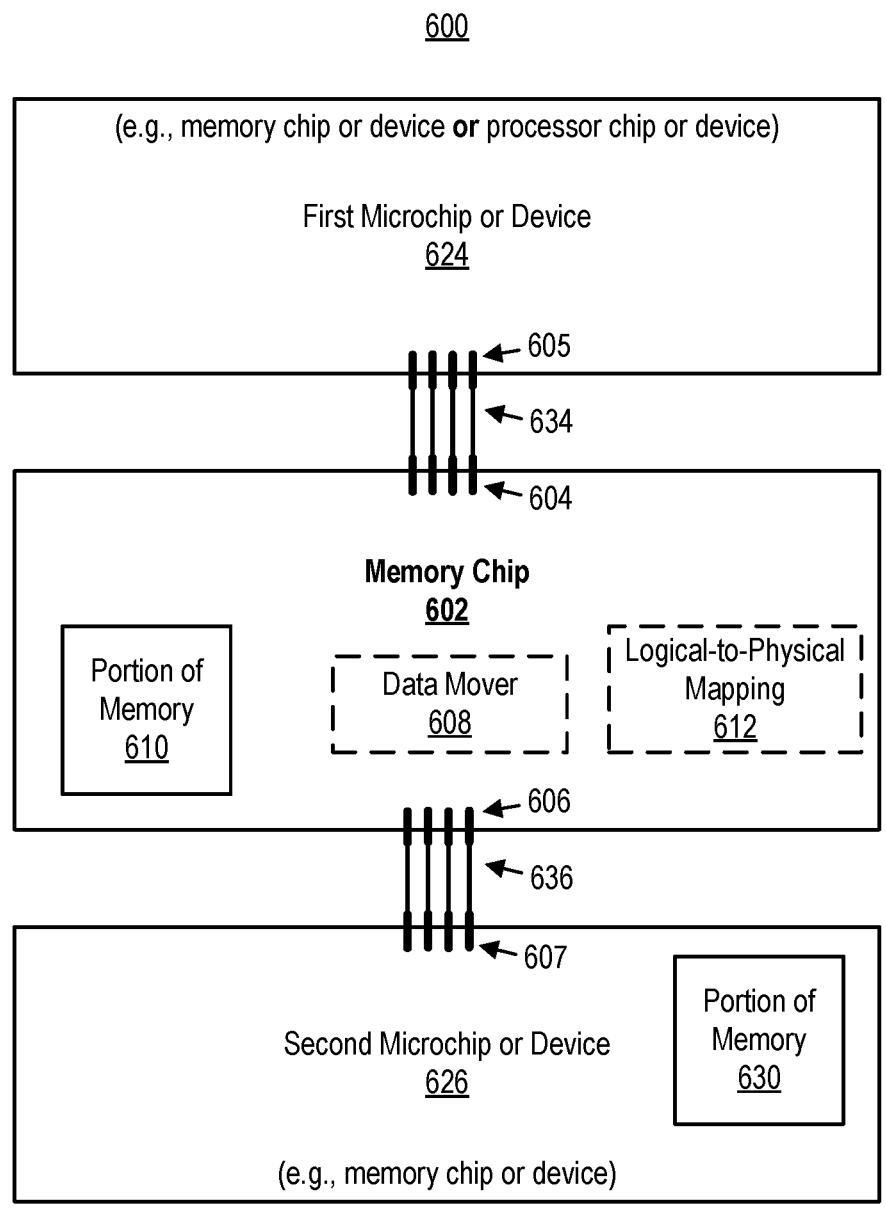
FIG. 6 illustrates an example system that includes a memory chip having an integrated data mover, in accordance with some embodiments of the present disclosure.
Figure 7:
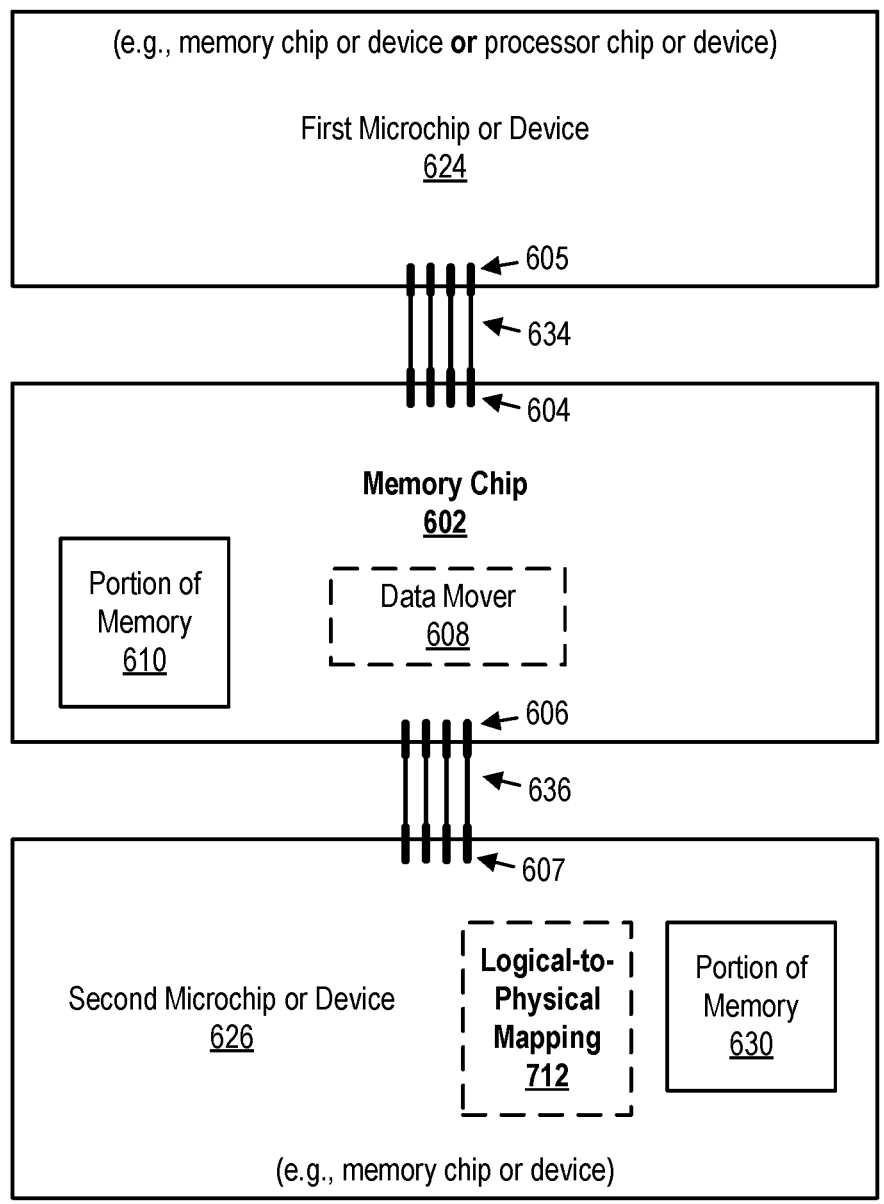
FIG. 7 illustrates an example system that includes the memory chip shown in FIG. 6 as well as a microchip or device that receives data transferred from the data mover and has logical-to-physical mapping for mapping the received data, in accordance with some embodiments of the present disclosure.
Figure 8:
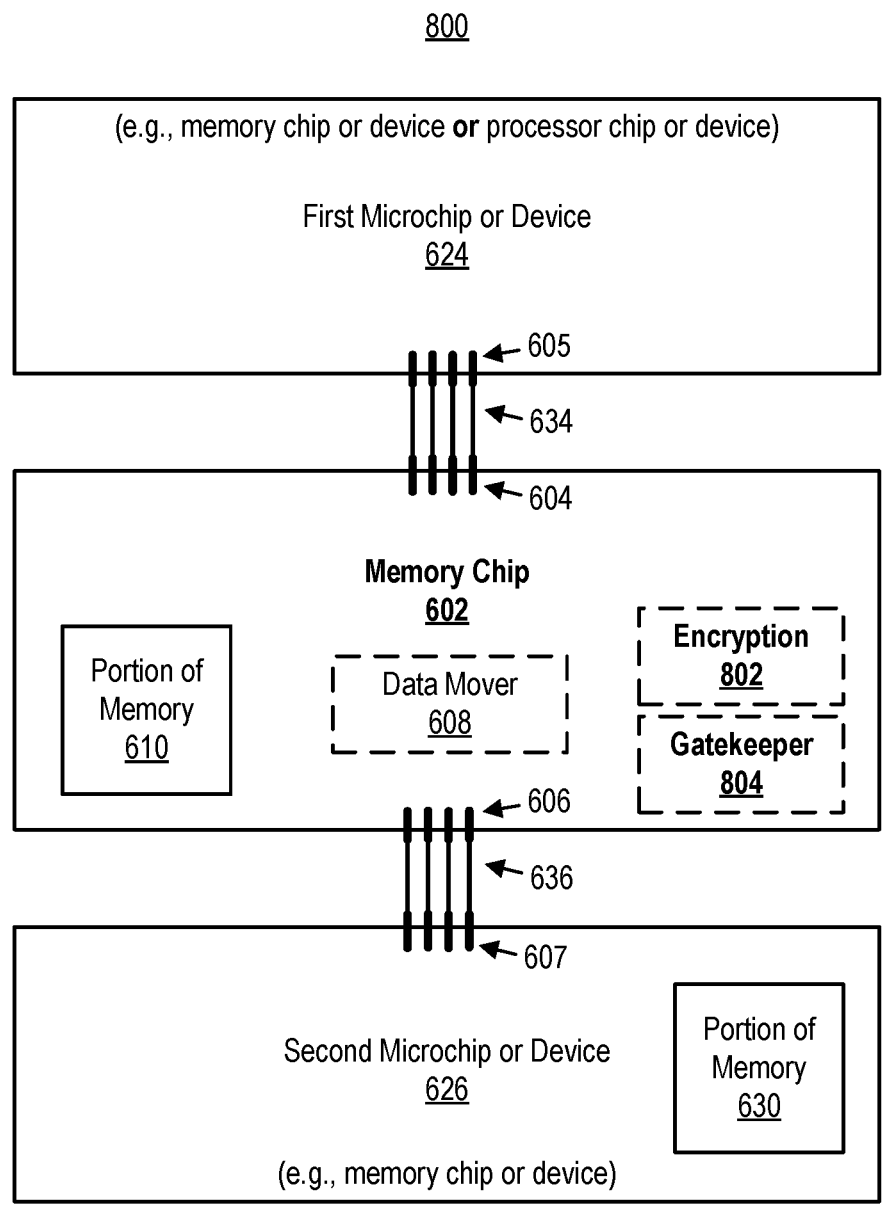
FIG. 8 illustrates an example system that includes the memory chip shown in FIG. 6 which is also shown having encryption and authentication circuitry, in accordance with some embodiments of the present disclosure.

At least some embodiments disclosed herein relate to a memory chip having an integrated data mover (e.g., see FIGS. 6-8 as well as corresponding text herein). Also, at least some embodiments disclosed herein relate to using such a memory chip in flexible provisioning of a string of memory chips to form a memory (e.g., see FIGS. 1-8 as well as corresponding text herein). For example, one or more instances of the memory chip depicted in FIGS. 6-8 can be used as one or more memory chips in flexible provisioning of the string of memory chips 102 shown in FIGS. 1-3 as well as the string of memory chips 402 shown in FIG. 4.

For the purposes of this disclosure, a data mover is a circuit in a memory chip or device that manages the transfer of data to another memory chip or device. Such a data mover can be used in a group of memory chips or devices in a memory hierarchy. Thus, a data mover can facilitate movement of data from one memory chip or device to another memory chip or device in a memory hierarchy.

The memory chip (e.g., see memory chip 602) that includes the integrated data mover (e.g., see data mover 608) can have two separate sets of pins (e.g., see sets of pins 604 and 606 shown in FIGS. 6-8) for respective separate connections to a first microchip or device (e.g., see first microchip or device 624 shown in FIGS. 6-8) and a second microchip or device (e.g., see second microchip or device 626 shown in FIGS. 6-8). The first microchip or device can be a processor, such as a system on a chip (SoC), or another memory chip. The second microchip or device can be another memory chip or a memory device such as a mass storage device.

In some embodiments, the memory chip can include an encryption engine (e.g., see encryption engine 802 shown in FIG. 8) in addition to the data mover to secure data to be moved to the second microchip or device. Also, in such embodiments and others, the memory chip can include a gatekeeper device (e.g., see gatekeeper 804 shown in FIG. 8) that can perform authentication for access of data stored in the second microchip or device.

The data mover can combine data stored in the memory chip (e.g., see portion of memory 610 having data accessible by the first microchip or device 624 as shown in FIGS. 6-8) on its way to the second microchip or device using various strategies. This can improve write performance and endurance of the second microchip or device.

In general, the memory chip can include a first set of pins, a second set of pins, and an integrated data mover. The first set of pins can be configured to allow the memory chip to be coupled to a first microchip or device via first wiring. The second set of pins can be configured to allow the memory chip to be coupled to a second microchip or device via second wiring that is separate from the first wiring. The data mover can be configured to facilitate access to the second microchip or device, via the second set of pins, to read data from the second microchip or device and write data to the second microchip or device.

The memory chip can be a non-volatile random-access memory (NVRAM) chip in that the memory chip includes a plurality of NVRAM cells. And, in some embodiments, the plurality of NVRAM cells can include a plurality of 3D XPoint memory cells. Also, the memory chip can be a dynamic random-access memory (DRAM) chip in that the memory chip includes a plurality of DRAM cells. Also, the memory chip can be a flash memory chip in that the memory chip includes a plurality of flash memory cells. The plurality of flash memory cells can include a plurality of NAND-type flash memory cells.

The first microchip or device can be another memory chip or a memory device or a processor chip or a processor device. In some embodiments, for example, the first microchip or device is a SoC. In some embodiments, for example, the first microchip or device is a DRAM chip. In some embodiments, for example, the first microchip or device is a NVRAM chip. Data stored in a portion of the memory chip can be accessible by or through the first microchip or device via the first set of pins. Also, when the data stored in the portion of the memory chip is accessible through the first microchip or device it is being accessed by another memory chip or device or a processor chip or device. And, the first microchip or device can read data from the memory chip as well as write data to the memory chip.

The second microchip or device can be another memory chip or a memory device. In some embodiments, for example, the second microchip or device is a DRAM chip.

In some embodiments, for example, the second microchip or device is a NVRAM chip. In some embodiments, for example, the second microchip or device is a flash memory chip (e.g., a NAND-type flash memory chip). Data stored in a portion of the second microchip or device can be accessible by or through the memory chip via the second set of pins. Also, when the data stored in the portion of the second microchip or device is accessible through the memory chip it is being accessed by another memory chip or device or a processor chip or device (such as the first microchip or device). And, the memory chip can read data from the second microchip or device as well as write data to the second microchip or device.

The data mover can be configured to combine the data stored in a portion of the memory chip by moving the data in blocks to the second microchip or device. For example, the data mover can be configured to combine the data stored in the portion of the memory chip that is accessible by or through the first microchip or device via the first set of pins by moving the data in blocks to the second microchip or device. The data mover by moving data in blocks can increase write performance and endurance of the second microchip or device, and sequential or block access on memory chips is orders of magnitude faster than random access on memory chips.

In some embodiments, the blocks are at a granularity that is coarser than the data initially stored in a portion of the memory chip. For example, the blocks are at a granularity that is coarser than the data initially stored in the portion of the memory chip that is accessible by or through the first microchip or device via the first set of pins. The blocks being at a granularity that is coarser than the pre-blocked data in the memory chip, such as the data to be accessed by first microchip or device, can reduce the frequency of data writes to the second microchip or device.

The data mover can also be configured to buffer movement of changes to the data stored in a portion of the memory chip, such as data stored in the portion of the memory chip that is accessible to the first microchip or device. And, in such embodiments, the data mover can also be configured to send write requests to the second microchip or device in a suitable size due to the buffering by the data mover. When the second microchip or device is a second microchip or device and a write to the second microchip or device is in the suitable size due to the buffering by the data mover, the second microchip or device can erase a block and program the block in the second microchip or device according to the write without further processing or minimal processing in the second microchip or device. This is one example way that the data mover integrated in the memory chip can improve write performance and endurance of the second microchip or device. Also, with the buffering by the data mover and when frequent and/or random changes are made to the data in a portion of the memory chip (such as the data in the portion of the chip accessible by the first microchip or device), the second microchip or device does not have to be frequently erased and reprogrammed in a corresponding way as the changes occurring in the portion of the memory chip.

The buffering by the data mover is even more beneficial when the second microchip or device is a flash memory chip because the buffering can remove or at least limit the effects of write amplification that occurs in flash memory. Write amplification can be reduced or even eliminated by the buffering because, with the buffering, a write request sent by the memory chip can be modified to a suitable size or granularity expected by the receiving flash memory chip.

Thus, the flash memory chip can erase a block and program the block according to the write request without possible duplication of the write and thus avoid further processing in the second microchip or device.

The data mover can also be configured to bundle changed addresses in the changes to the data stored in a portion of the memory chip (such as the data in the portion of the memory chip accessible to the first microchip or device). In such embodiments, the data mover can also be configured to write bundled changed addresses into another portion of the memory chip to be moved to the second microchip or device via a write request to the second microchip or device. These features of the data mover can improve the buffering by the data mover and the sending of write requests according to the buffering since the bundling of changed addresses can be controlled by the data mover to correspond to a suitable size or granularity expected by the receiving second microchip or device.

In some embodiments, the memory chip can also include logical-to-physical mapping for the second microchip or device (e.g., see logical-to-physical mapping 612 shown in FIG. 6). And, the logical-to-physical mapping for the second microchip or device can be configured to use the bundled changed addresses as input. In some other embodiments, the second microchip or device can include logical-to-physical mapping for itself (e.g., see logical-to-physical mapping 712 shown in FIG. 7) that is configured to use the bundled changed addresses as input once the bundled changed addresses are sent in a write request to the second microchip or device.

Some embodiments described herein can include a system that includes an intermediate memory chip (e.g., see memory chip 602), a first memory chip (e.g., see first microchip or device 624), and a second memory chip (e.g., see second microchip or device 626). In such embodiments, the intermediate memory chip can be a NVRAM chip (e.g., a 3D XPoint memory chip), the second memory chip can be a flash memory chip (e.g., a NAND-type flash memory chip), and the first memory chip can be a DRAM chip. Some other embodiments described herein can include a system that includes an intermediate memory chip (e.g., see memory chip 602), a second memory chip (e.g., see second microchip or device 626), and a processor chip, such as a SoC (e.g., see first microchip or device 624). In such embodiments, the intermediate memory chip can be a NVRAM chip (e.g., a 3D XPoint memory chip) or a DRAM chip and the second memory chip can be a flash memory chip (e.g., a NAND-type flash memory chip) or a NVRAM chip.

Also, at least some aspects of the present disclosure are directed to flexible provisioning of a string of memory chips to form a memory for a processor chip or system on a chip (SoC), e.g., see FIGS. 1-5 as well as corresponding text herein. From the perspective of the processor chip or SoC wired to the memory, the string of memory chips of the memory appears no different from a single memory chip implementation; however, with the flexible provisioning, benefits of using a string of memory chips is achieved. For example, with the flexible provisioning, benefits of using a string of memory chips with a memory hierarchy can be achieved.

The processor chip or SoC can be directly wired to a first memory chip in the string and can interact with the first memory chip without perceiving the memory chips in the string downstream of the first memory chip. In the memory, the first memory chip can be directly wired to a second memory chip and can interact with the second memory chip such that the processor chip or SoC gains the benefits of the string of the first and second memory chips without perceiving the second memory chip. And, the second memory chip can be directly wired to a third memory chip and so forth such that the processor chip or SoC gains benefits of the string of multiple memory chips without perceiving and interacting with the multiple memory chips downstream of the first memory chip. Also, in some embodiments, each chip in the string perceives and interacts with the immediate upstream chip and downstream chip in the string without perceiving chips in the string further upstream or downstream.

In some embodiments, the first memory chip in the string can be a DRAM chip. The second memory chip in the string immediately downstream of the first chip can be a NVRAM chip (e.g., a 3D XPoint memory chip). The third memory chip in the string immediately downstream of the second chip can be a flash memory chip (e.g., a NAND-type flash memory chip). Also, for example, the string can be DRAM to DRAM to NVRAM, or DRAM to NVRAM to NVRAM, or DRAM to flash memory to flash memory; although, DRAM to NVRAM to flash memory may provide a more effective solution for a string of memory chips being flexibly provisioned as multi-tier memory. Also, for the sake of understanding the flexible provisioning of a string of memory chips disclosed herein, examples will often refer to a three-chip string of memory chips; however, it is to be understood that the string of memory chips can include more than three memory chips.

Also, for the purposes of this disclosure, it is to be understood that that DRAM, NVRAM, 3D XPoint memory, and flash memory are techniques for individual memory units, and that a memory chip for any one of the memory chips described herein can include a logic circuit for command and address decoding as well as arrays of memory units of DRAM, NVRAM, 3D XPoint memory, or flash memory. For example, a DRAM chip described herein includes a logic circuit for command and address decoding as well as an array of memory units of DRAM. Also, for example, a NVRAM chip described herein includes a logic circuit for command and address decoding as well as an array of memory units of NVRAM. And, for example, a flash memory chip described herein includes a logic circuit for command and address decoding as well as an array of memory units of flash memory.

Also, a memory chip for any one of the memory chips described herein can include a cache or buffer memory for incoming and/or outgoing data. In some embodiments, the memory units that implement the cache or buffer memory may be different from the units on the chip hosting the cache or buffer memory. For example, the memory units that implement the cache or buffer memory can be memory units of SRAM.

Each of the chips in the string of memory chips can be connected to the immediate downstream and/or upstream chip via wiring, e.g., peripheral component interconnect express (PCIe) or serial advanced technology attachment (SATA). Each of the connections between the chips in the string of memory chips can be connected sequentially with wiring and the connections can be separate from each other. Each chip in the string of memory chips can include one or more sets of pins for connecting to an upstream chip and/or downstream chip in the string. In some embodiments, each chip in the string of memory chips can include a single integrated circuit (IC) enclosed within an IC package. In such embodiments, the IC package can include the sets of pins on the boundaries of the package.

The first memory chip (e.g., DRAM chip) in the string of memory chips of the memory for the processor chip or the SoC can include a portion that can be configured, such as by the processor chip or SoC, as the cache for the second memory chip (e.g., NVRAM chip) in the string of memory chips. A portion of the memory units in the first memory chip can be used as the cache memory for the second memory chip.

The second memory chip in the string of memory chips of the memory for the processor chip or the SoC can include a portion that can be configured, such as by the first memory chip directly and the processor chip or SoC indirectly, as the buffer for accessing the third memory chip (e.g., flash memory chip) in the string of memory chips. A portion of the memory units in the second memory chip can be used as the buffer for accessing the third memory chip. Also, the second memory chip can include a portion that can be configured, such as by the first memory chip directly and the processor chip or SoC indirectly, as a table for logical-to-physical address mapping (logical-to-physical table) or as logical-to-physical address mapping in general. A portion of the memory units in the second memory chip can be used for the logical-to-physical address mapping.

The third memory chip in the string of memory chips of the memory for the processor chip or the SoC can include a controller that can use the logical-to-physical address mapping in the second memory chip to manage a translation layer (e.g., flash translation layer function) of the third memory chip. The translation layer of the third memory chip can include logical-to-physical address mapping such as a copy or derivative of the logical-to-physical address mapping in the second memory chip.

Also, in some embodiments, the processor chip or SoC connected to the memory can configure the locations and the sizes of the cache in the first memory chip, the buffer and the logical-to-physical address mapping in the second memory chip, as well as cache policy parameters (e.g., write through vs write back) in the first chip by writing data into the first memory chip. And, the aforesaid configurations and settings by the processor chip or SoC can be delegated to a second data processing chip so that such tasks are removed from the processor chip or SoC. For example, the memory having the string of memory chips can have a dedicated controller separate from the processor chip or SoC configured to provide and control the aforesaid configurations and settings for the memory.

In general, with the techniques described herein to provide flexible provisioning of multi-tier memory, the flexibility to allocate a portion of memory units on certain memory chips in the string of chips as a cache or a buffer is how the memory chips (e.g., the DRAM, NVRAM, and flash memory chips) are configured to make the connectivity workable and flexible. The cache and buffer operations allow downstream memory devices of different sizes and/or different types to be connected to the upstream devices, and vice versa. In a sense, some functionalities of a memory controller are implemented in the memory chips to enable the operations of cache and buffer in the memory chips.

Figure 1:
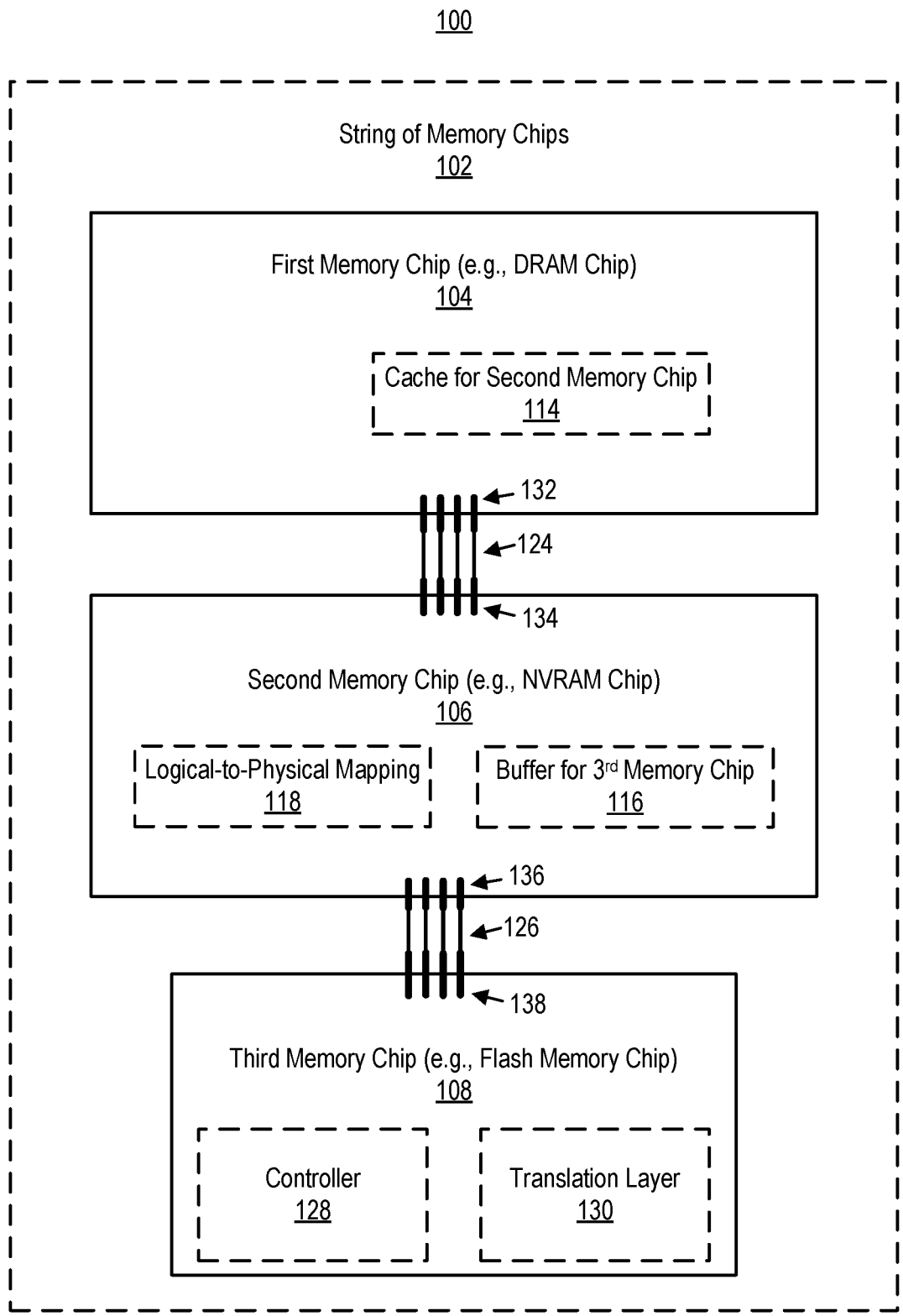
FIG. 1 illustrates an example memory system that is configured to provide flexible provisioning of multi-tier memory, in accordance with some embodiments of the present disclosure.

FIG. 1 illustrates an example memory system 100 that is configured to provide flexible provisioning of multi-tier memory, in accordance with some embodiments of the present disclosure. The memory system 100 includes a first memory chip 104 in a string of memory chips 102 of a memory. The memory system 100 also includes a second memory chip 106 in the string of memory chips 102 and a third memory chip 108 in the string of memory chips.

In FIG. 1, the first memory chip 104 is directly wired to the second memory chip 106 (e.g., see wiring 124) and is configured to interact directly with the second memory chip. Also, the second memory chip 106 is directly wired to the third memory chip 108 (e.g., see wiring 126) and is configured to interact directly with the third memory chip.

Also, each chip in the string of memory chips 102 can include one or more sets of pins for connecting to an upstream chip and/or downstream chip in the string (e.g., see sets of pins 132, 134, 136, and 138). In some embodiments, each chip in the string of memory chips (e.g., see string of memory chips 102 or string of groups of memory chips 402 shown in FIG. 4) can include a single IC enclosed within a IC package. For example, set of pins 132 is part of first memory chip 104 and connects first memory chip 104 to second memory chip 106 via wiring 124 and set of pins 134 that is part of second memory chip 106. The wiring 124 connects the two sets of pins 132 and 134. Also, for example, set of pins 136 is part of second memory chip 106 and connects second memory chip 106 to third memory chip 108 via wiring 126 and set of pins 138 that is part of third memory chip 108. The wiring 126 connects the two sets of pins 136 and 138.

Also, as shown, the first memory chip 104 includes a cache 114 for the second memory chip 106. And, the second memory chip 106 includes a buffer 116 for the third memory chip 108 as well as logical-to-physical mapping 118 for the third memory chip 108.

Figure 2:
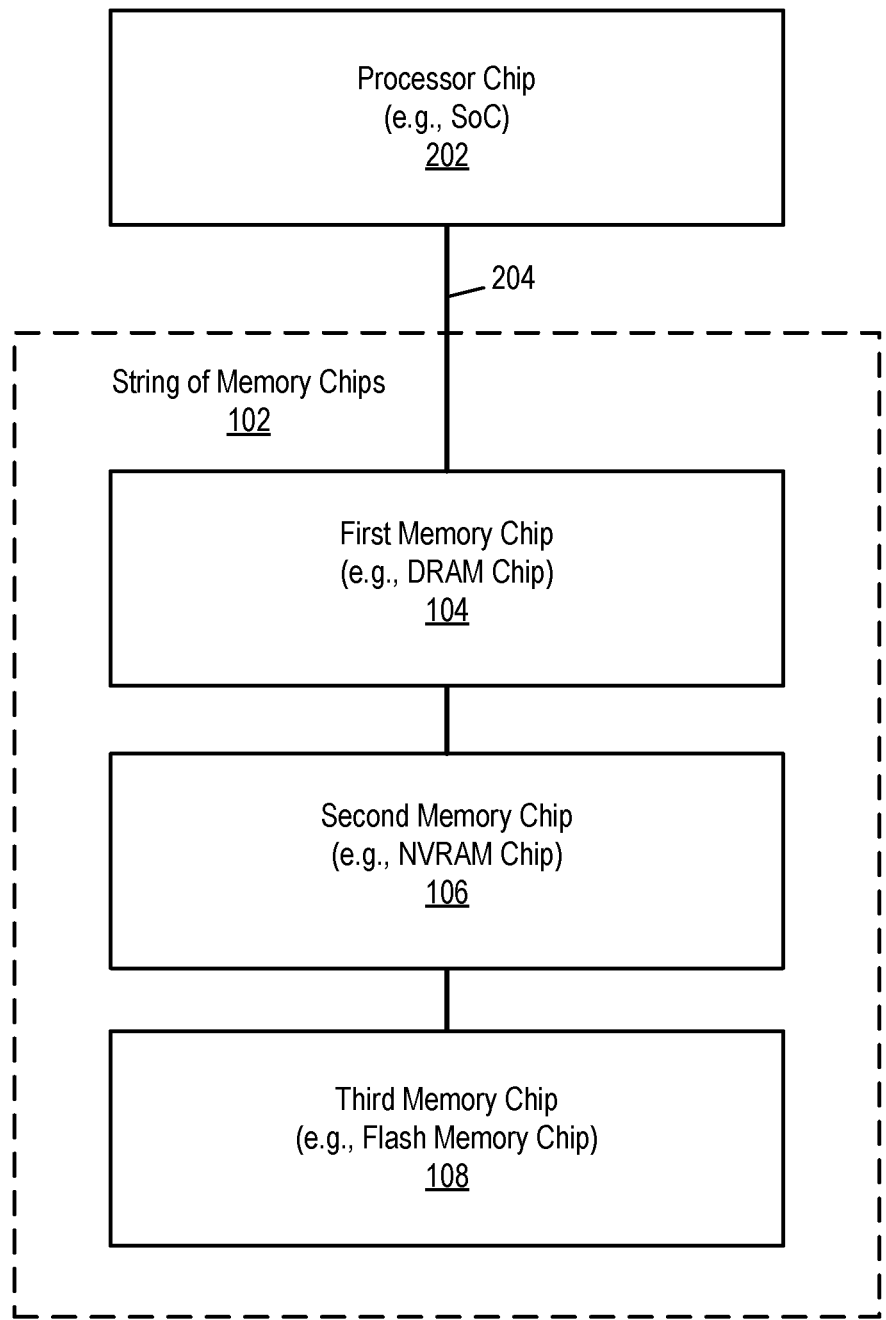
FIG. 2 illustrates an example memory system and processor chip configured to provide flexible provisioning of multi-tier memory, in accordance with some embodiments of the present disclosure.
Figure 3:
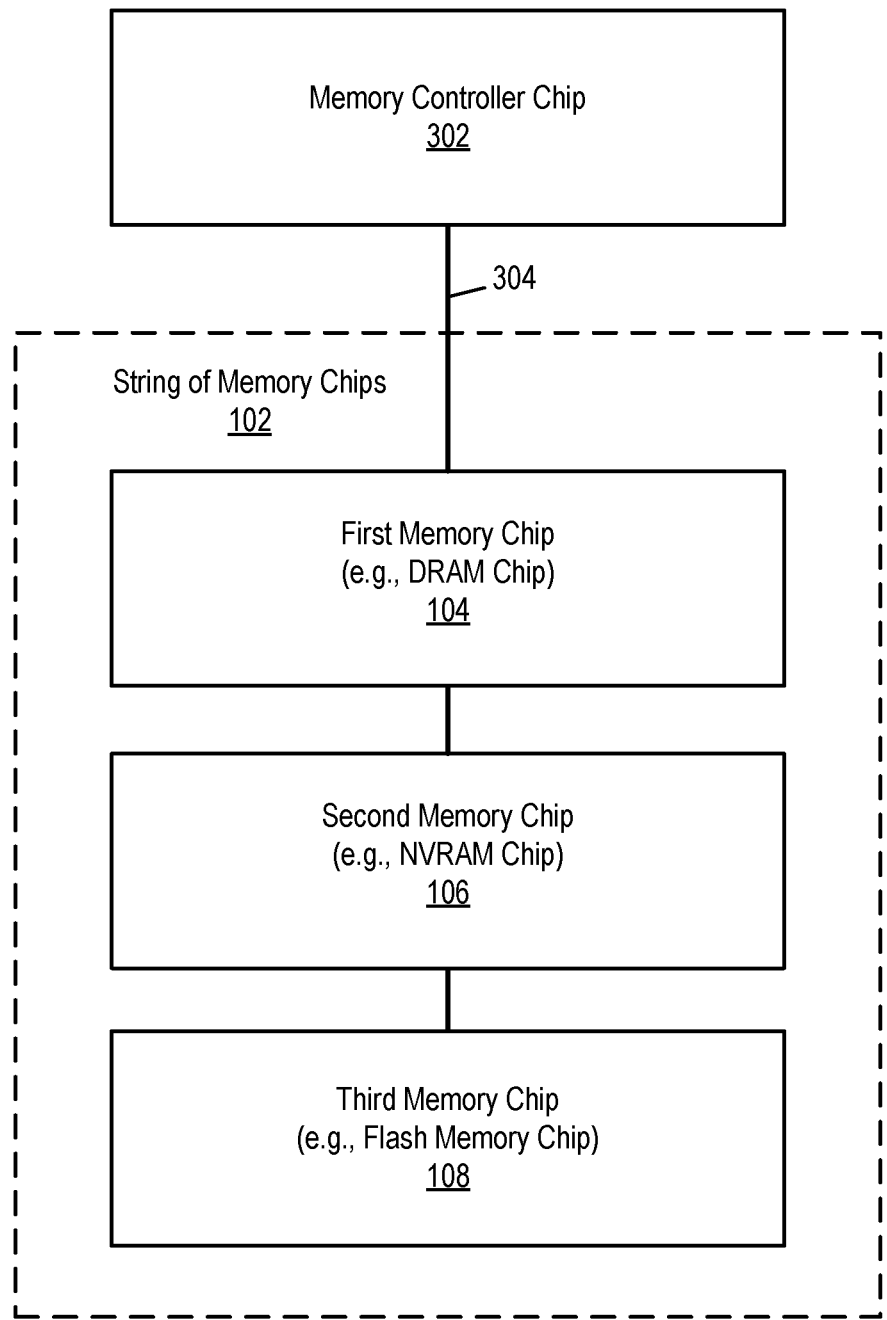
FIG. 3 illustrates an example memory system and memory controller chip configured to provide flexible provisioning of multi-tier memory, in accordance with some embodiments of the present disclosure.

The cache 114 for the second memory chip 106 can be configured by a processor chip or a memory controller chip (e.g., see processor chip 202 shown in FIG. 2 and memory controller chip 302 shown in FIG. 3). Locations and the sizes of the cache 114 in the first memory chip 104 can be configured by the processor chip or memory controller chip by corresponding data being written into the first memory chip by the processor or memory controller chip. Also, cache policy parameters of the cache 114 in the first memory chip 104 can be configured by the processor or memory controller chip by corresponding data being written into the first memory chip by the processor or the memory controller chip.

The buffer 116 for the third memory chip 108 can be configured by a processor chip or a memory controller chip (e.g., see processor chip 202 shown in FIG. 2 and memory controller chip 302 shown in FIG. 3). Locations and the sizes of the buffer 116 in the second memory chip 106 can be configured by the processor chip or memory controller chip by corresponding data being written into the second memory chip by the processor or memory controller chip, such as indirectly via the first memory chip 104. Also, buffer policy parameters of the buffer 116 in the second memory chip 106 can be configured by the processor or memory controller chip by corresponding data being written into the second memory chip by the processor or the memory controller chip, such as indirectly via the first memory chip 104.

The logical-to-physical mapping 118 for the third memory chip 108 can be configured by a processor chip or a memory controller chip (e.g., see processor chip 202 shown in FIG. 2 and memory controller chip 302 shown in FIG. 3). Locations and the sizes of the logical-to-physical mapping 118 in the second memory chip 106 can be configured by the processor chip or memory controller chip by corresponding data being written into the second memory chip by the processor or memory controller chip, such as indirectly via the first memory chip 104. Also, buffer policy parameters of the logical-to-physical mapping 118 in the second memory chip 106 can be configured by the processor or memory controller chip by corresponding data being written into the second memory chip by the processor or the memory controller chip, such as indirectly via the first memory chip 104.

In some embodiments, the third memory chip 108 can have a lowest memory bandwidth of the chips in the string. In some embodiments, the first memory chip 104 can have a highest memory bandwidth of the chips in the string. In such embodiments, the second memory chip 106 can have a next highest memory bandwidth of the chips in the string, such that the first memory chip 104 has a highest memory bandwidth of the chips in the string and the third memory chip 108 has a lowest memory bandwidth of the chips in the string.

In some embodiments, the first memory chip 104 is or includes a DRAM chip. In some embodiments, the first memory chip 104 is or includes a NVRAM chip. In some embodiments, the second memory chip 106 is or includes a DRAM chip. In some embodiments, the second memory chip 106 is or includes a NVRAM chip. In some embodiments, the third memory chip 108 is or includes a DRAM chip. In some embodiments, the third memory chip 108 is or includes a NVRAM chip. And, in some embodiments, the third memory chip 108 is or includes a flash memory chip.

In embodiments having one or more DRAM chips, a DRAM chip can include a logic circuit for command and address decoding as well as arrays of memory units of DRAM. Also, a DRAM chip described herein can include a cache or buffer memory for incoming and/or outgoing data. In some embodiments, the memory units that implement the cache or buffer memory can be different from the DRAM units on the chip hosting the cache or buffer memory. For example, the memory units that implement the cache or buffer memory on the DRAM chip can be memory units of SRAM.

In embodiments having one or more NVRAM chips, a NVRAM chip can include a logic circuit for command and address decoding as well as arrays of memory units of NVRAM such as units of 3D XPoint memory. Also, a NVRAM chip described herein can include a cache or buffer memory for incoming and/or outgoing data. In some embodiments, the memory units that implement the cache or buffer memory can be different from the NVRAM units on the chip hosting the cache or buffer memory. For example, the memory units that implement the cache or buffer memory on the NVRAM chip can be memory units of SRAM.

In some embodiments, NVRAM chips can include a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

As mentioned herein, NVRAM chips can be or include cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In embodiments having one or more flash memory chips, a flash memory chip can include a logic circuit for command and address decoding as well as arrays of memory units of flash memory such as units of NAND-type flash memory. Also, a flash memory chip described herein can include a cache or buffer memory for incoming and/or outgoing data. In some embodiments, the memory units that implement the cache or buffer memory can be different from the flash memory units on the chip hosting the cache or buffer memory. For example, the memory units that implement the cache or buffer memory on the flash memory chip can be memory units of SRAM.

Also, for example, an embodiment of the string of memory chips can include DRAM to DRAM to NVRAM, or DRAM to NVRAM to NVRAM, or DRAM to flash memory to flash memory; however, DRAM to NVRAM to flash memory may provide a more effective solution for a string of memory chips being flexibly provisioned as multi-tier memory.

Also, for the purposes of this disclosure, it is to be understood that that DRAM, NVRAM, 3D XPoint memory, and flash memory are techniques for individual memory units, and that a memory chip for any one of the memory chips described herein can include a logic circuit for command and address decoding as well as arrays of memory units of DRAM, NVRAM, 3D XPoint memory, or flash memory. For example, a DRAM chip described herein includes a logic circuit for command and address decoding as well as an array of memory units of DRAM. For example, a NVRAM chip described herein includes a logic circuit for command and address decoding as well as an array of memory units of NVRAM. For example, a flash memory chip described herein includes a logic circuit for command and address decoding as well as an array of memory units of flash memory.

Also, a memory chip for any one of the memory chips described herein can include a cache or buffer memory for incoming and/or outgoing data. In some embodiments, the memory units that implement the cache or buffer memory may be different from the units on the chip hosting the cache or buffer memory. For example, the memory units that implement the cache or buffer memory can be memory units of SRAM.

FIG. 2 illustrates the example memory system 100 and processor chip 202 configured to provide flexible provisioning of multi-tier memory, in accordance with some embodiments of the present disclosure. In FIG. 2, the processor chip 202 is directly wired (e.g., see wiring 204) to the first memory chip 104 and is configured to interact directly with the first memory chip.

In some embodiments, the processor chip 202 includes or is a SoC. A SoC describe herein can be or include an integrated circuit or chip that integrates any two or more components of a computing device. The two or more components can include at least one or more of a central processing unit (CPU), graphics processing unit (GPU), memory, input/output ports, and secondary storage. For example, an SoC described herein can also include a CPU, a GPU, graphics and memory interfaces, hard-disk, USB connectivity, random-access memory, read-only memory, secondary storage, or any combination thereof on a single circuit die. Also, where the processor chip 202 is a SoC, the SoC includes at least a CPU and/or a GPU.

For an SoC described herein, the two or more components can be embedded on a single substrate or microchip (chip).

In general, a SoC is different from a conventional motherboard-based architecture in that the SoC integrates all of its components into a single integrated circuit; whereas a motherboard houses and connects detachable or replaceable components. Because the two or more components are integrated on a single substrate or chip, SoCs consume less power and take up much less area than multi-chip designs with equivalent functionality. Thus, in some embodiments, the memory systems described herein can be connected with or be a part of SoCs in mobile computing devices (such as in smartphones), embedded systems, and the Internet of Things devices.

The processor chip 202 can be configured to configure the cache 114 for the second memory chip 106. The processor chip 202 can also be configured to configure locations and the sizes of the cache 114 by writing corresponding data into the first memory chip 104. The processor chip 202 can also be configured to configure cache policy parameters by writing corresponding data into the first memory chip 104.

Also, the processor chip 202 can configured to configure the buffer 116 for the third memory chip 108 and/or the logical-to-physical mapping 118 for the third memory chip. The processor chip 202 can also be configured to configure locations and sizes of the buffer 116 by writing corresponding data into the first memory chip 104. The processor chip 202 can also be configured to configure locations and the sizes of the logical-to-physical mapping 118 by writing corresponding data into the first memory chip 104.

FIG. 3 illustrates the example memory system 100 and memory controller chip 302 configured to provide flexible provisioning of multi-tier memory, in accordance with some embodiments of the present disclosure. In FIG. 3, the memory controller chip 302 is directly wired (e.g., see wiring 304) to the first memory chip 104 and is configured to interact directly with the first memory chip.

In some embodiments, the memory controller chip 302 includes or is a SoC. Such a SoC can be or include an integrated circuit or chip that integrates any two or more components of a computing device. The two or more components can include at least one or more of a separate memory, input/output ports, and separate secondary storage. For example, the SoC can include memory interfaces, hard-disk, USB connectivity, random-access memory, read-only memory, secondary storage, or any combination thereof on a single circuit die. Also, where the memory controller chip 302 is a SoC, the SoC includes at least a data processing unit.

The memory controller chip 302 can be configured to configure the cache 114 for the second memory chip 106. The memory controller chip 302 can also be configured to configure locations and the sizes of the cache 114 by writing corresponding data into the first memory chip 104. The memory controller chip 302 can also be configured to configure cache policy parameters by writing corresponding data into the first memory chip 104.

Also, the memory controller chip 302 can configured to configure the buffer 116 for the third memory chip 108 and/or the logical-to-physical mapping 118 for the third memory chip. The memory controller chip 302 can also be configured to configure locations and sizes of the buffer 116 by writing corresponding data into the first memory chip 104. The memory controller chip 302 can also be configured to configure locations and the sizes of the logical-to-physical mapping 118 by writing corresponding data into the first memory chip 104.

Figure 4:
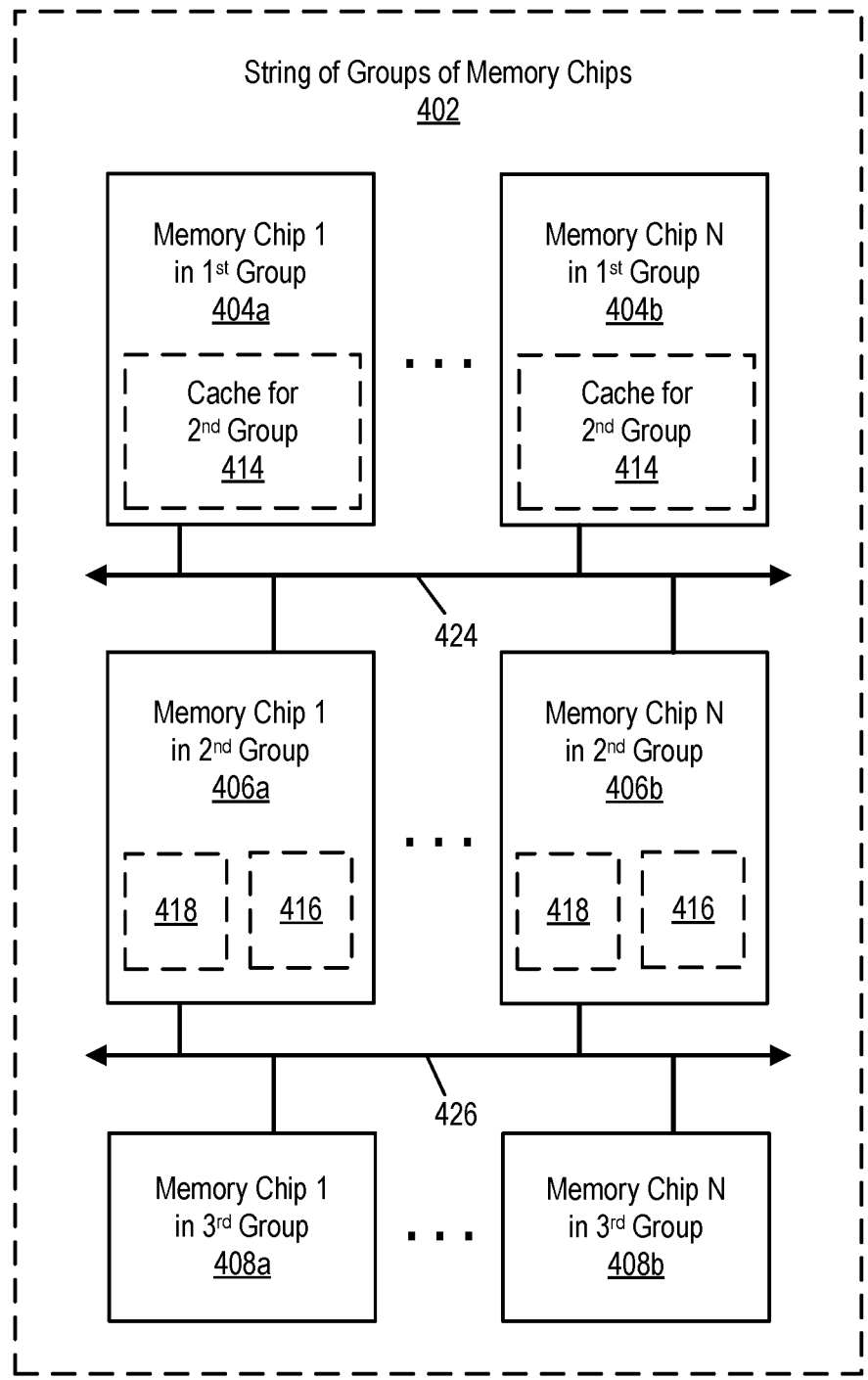
FIG. 4 illustrates an example memory system configured to provide flexible provisioning of multi-tier memory with tiers that each include multiple memory chips, in accordance with some embodiments of the present disclosure.

FIG. 4 illustrates an example memory system 400 configured to provide flexible provisioning of multi-tier memory with tiers that each include multiple memory chips, in accordance with some embodiments of the present disclosure. The memory system 400 includes a string of groups of memory chips 402. The string of groups of memory chips 402 includes a first group of memory chips including a first type of memory chips (e.g., see memory chips 404a and 404b which are the same type of chips). The string of groups of memory chips 402 includes a second group of memory chips including the first type of memory chips or a second type of memory chips (e.g., see memory chips 406a and 406b which are the same type of chips). The string of groups of memory chips 402 also includes a third group of memory chips including a first type of memory chips, a second type of memory chips, or a third type of memory chips (e.g., see memory chips 408a and 408b which are the same type of chips). The first type of memory chips can be or include DRAM chips. The second type of memory chips can be or include NVRAM chips. The third type of memory chips can be or include flash memory chips.

Also, as shown in FIG. 4, the chips in the first group of memory chips are directly wired to the chips in the second group of memory chips via wiring 424 and are configured to interact directly with one or more of the chips in the second group of memory chips. Also, as shown in FIG. 4, the chips in the second group of memory chips are directly wired to the chips in the third group of memory chips via wiring 426 and are configured to interact directly with one or more of the chips in the third group of memory chips.

Also, as shown in FIG. 4, each chip in the first group of memory chips includes a cache (e.g., see cache 414) for the second group of memory chips. And, each chip in the second group of memory chips includes a buffer 416 for the third group of memory chips as well as logical-to-physical mapping 418 for the third group of memory chips.

In some embodiments, each chip in the third group of memory chips (e.g., see memory chips 408a and 408b) can have a lowest memory bandwidth relative to the other chips in the string of groups of memory chips 402. In some embodiments, each chip in the first group of memory chips (e.g., see memory chips 404a and 404b) can have a highest memory bandwidth relative to the other chips in the string of groups of memory chips 402. In such embodiments, each chip in the second group of memory chips (e.g., see memory chips 406a and 406b) can have a next highest memory bandwidth relative to other chips in the string of groups of memory chips 402, such that each chip in the first group of memory chips has a highest memory bandwidth and each chip in the third group of memory chips has a lowest memory bandwidth.

In some embodiments, the first group of memory chips (e.g., see memory chips 404a and 404b) can include DRAM chips or NVRAM chips. In some embodiments, the second group of memory chips (e.g., see memory chips 406a and 406b) can include DRAM chips or NVRAM chips. In some embodiments, the third group of memory chips (e.g., see memory chips 408a and 408b) can include DRAM chips, NVRAM chips, or flash memory chips.

As shown in FIGS. 1-4, the present disclosure is directed to flexible provisioning of a string of memory chips (e.g., see string of memory chips 102 shown in FIGS. 1-3 or string of groups of memory chips 402 shown in FIG. 4). And, the flexible provisioning of the string of memory chips forms a memory (e.g., see memory system 100 shown in FIG. 2 or memory system 400 shown in FIG. 4).

A memory system disclosed herein, such as memory system 100 or 400, can be its own apparatus or within its own packaging.

In some embodiments, a memory system disclosed herein, such as memory system 100 or 400, can be combined with and for a processor chip or SoC (e.g., see FIG. 2). When combined with and for a processor chip or SoC, the memory system and the processor chip or SoC can be a part of a single apparatus and/or combined into a single packaging.

Also, in some embodiments, a memory system disclosed herein, such as memory system 100 or 400, can be combined with a memory controller chip (e.g., see FIG. 3). When combined with a memory controller chip, the memory system and the memory controller chip can be a part of a single apparatus and/or combined into a single packaging. Alternatively, each chip in the string of chips, or at least the first memory chip and the second memory chip, can include a respective memory controller providing similar functionality to the memory controller chip shown in FIG. 3.

From the perspective of the processor chip or SoC wired to the memory (e.g., see processor chip 202 shown in FIG. 2) or the memory controller chip (e.g., see memory controller chip 302 shown in FIG. 3), the string of memory chips of the memory appears no different from a single memory chip implementation; however, with the flexible provisioning, benefits of using a string of memory chips is achieved. In such embodiments, the processor chip or SoC—or the memory controller chip—can be directly wired (e.g., see wiring 204 shown in FIG. 2 or wiring 304 shown in FIG. 3) to a first memory chip (e.g., see first memory chip 104) in the string of memory chips 102 and can interact with the first memory chip without perceiving the memory chips in the string downstream of the first memory chip (e.g., see second memory chip 106 and third memory chip 108 which are downstream of the first memory chip 104).

In the memory (e.g., see memory system 100 or 400), the first memory chip (e.g., see first memory chip 104 or one of memory chips 404*a* or 404*b*) can be directly wired to a second memory chip (e.g., see second memory chip 106 or one of memory chips 406*a* or 406*b*) and can interact with the second memory chip such that the processor chip, SoC, or memory controller chip (e.g., see processor chip 202 and memory controller chip 302) gains the benefits of the string of the first and second memory chips without perceiving the second memory chip. And, the second memory chip (e.g., see first memory chip 104 or one of memory chips 404*a* or 404*b*) can be directly wired to a third memory chip (e.g., see third memory chip 108 or one of memory chips 408*a* or 408*b*) and so forth such that the processor chip, SoC, or memory controller chip gains benefits of the string of multiple memory chips (e.g., see string of memory chips 102 or string of groups of memory chips 402) without perceiving and interacting with the multiple memory chips downstream of the first memory chip. Also, in some embodiments, each chip in the string perceives and interacts with an immediate upstream chip and downstream chip in the string without perceiving chips in the string further upstream or downstream.

As mentioned, with the flexible provisioning, benefits of using a string of memory chips with a memory hierarchy can be achieved. Thus, for example, in some embodiments, the first memory chip (e.g., see first memory chip 104) in the string can be a chip with the highest memory bandwidth in the memory. The second memory chip (e.g., see second memory chip 106) in the string immediately downstream of the first chip can be a chip with next highest memory bandwidth of the memory (which may have other benefits such as being cheaper to manufacture than the first chip or be more reliable or persistent at storing data than the first chip). The third memory chip (e.g., see third memory chip 108) in the string immediately downstream of the second chip (or the final downstream chip in the string where the string has more than three memory chips) can have the lowest memory bandwidth. The third memory chip in such examples (or the final downstream chip in other examples with more than three memory chips) can be the most cost-effective chip or most reliable or persistent chip for storing data.

In some embodiments, the first memory chip in the string can be a DRAM chip. In such embodiments, the second memory chip in the string immediately downstream of the first chip can be a NVRAM chip (e.g., a 3D XPoint memory chip). And, in such embodiments, the third memory chip in the string immediately downstream of the second chip can be a flash memory chip (e.g., a NAND-type flash memory chip).

As mentioned, for the sake of understanding the flexible provisioning of a string of memory chips disclosed here, examples often refer to a three-chip string of memory chips (e.g., see string of memory chips 102 shown in FIGS. 1-3 and string of groups of memory chips 402 shown in FIG. 4); however, it is to be understood that the string of memory chips can include more than three memory chips or more than three groups of chips where each of the groups is a tier of chips.

As mentioned, some embodiments of string of memory chips can include a DRAM memory chip that is the first chip in the string, a NVRAM chip that is the second chip in the string, and a flash memory chip (e.g., NAND-type flash memory chip) that is the third chip in the string and can be used as the bulk memory chip in the string. In such embodiments and in other embodiments with other arrangements of memory chip types, each of the chips in the string of memory chips are connected to the immediate downstream and/or upstream chip via wiring (e.g., PCIe or SATA). Each of the connections between the chips in the string of memory chips can be connected sequentially with wiring and the connections can be separate from each other (e.g., see wiring 124 and 126 as well as wiring 424 and 426). Also, each chip in the string of memory chips can include one or more sets of pins for connecting to an upstream chip and/or downstream chip in the string (e.g., see sets of pins 132, 134, 136, and 138 depicted in FIG. 1). In some embodiments, each chip in the string of memory chips (e.g., see string of memory chips 102 or string of groups of memory chips 402) can include a single IC enclosed within a IC package. In such embodiments, the IC package can include the sets of pins on the boundaries of the package (such as sets of pins 132, 134, 136, and 138).

The first memory chip (e.g., DRAM chip) in the string of memory chips of the memory for the processor chip or the SoC can include a portion that can be configured, such as by the processor chip or SoC, as the cache for the second memory chip (e.g., NVRAM chip) in the string (e.g., see cache 114 for the second memory chip). A portion of the memory units in the first memory chip can be used as the cache memory for the second memory chip.

The second memory chip in the string of memory chips of the memory for the processor chip or the SoC can include a portion that can be configured, such as by the first memory chip directly and the processor chip or SoC indirectly, as the buffer for accessing the third memory chip (e.g., flash memory chip) in the string (e.g., see buffer for the third memory chip 116). A portion of the memory units in the second memory chip can be used as the buffer for accessing the third memory chip. Also, the second memory chip can include a portion that can be configured, such as by the first memory chip directly and the processor chip or SoC indirectly, as a table for logical-to-physical address mapping (logical-to-physical table) or as logical-to-physical address mapping in general (e.g., see logical-to-physical mapping 118). A portion of the memory units in the second memory chip can be used for the logical-to-physical address mapping.

The third memory chip in the string of memory chips of the memory for the processor chip or the SoC can include a controller (e.g., see controller 128) that can use the logical-to-physical address mapping in the second memory chip to manage a translation layer (e.g., flash translation layer function) of the third memory chip (e.g., see translation layer 130). The translation layer of the third memory chip can include logical-to-physical address mapping such as a copy or derivative of the logical-to-physical address mapping in the second memory chip.

Also, in some embodiments, the processor chip or SoC connected to the memory (e.g., see processor chip 202) can configure the locations and the sizes of the cache in the first memory chip, the buffer and the logical-to-physical address mapping in the second memory chip, as well as cache policy parameters (e.g., write through vs write back) in the first chip by writing data into the first memory chip (e.g., see first memory chip 104). And, the aforesaid configurations and settings by the processor chip or SoC can be delegated to a second data processing chip so that such tasks are removed from the processor chip or SoC (e.g., see memory controller chip 302 shown in FIG. 3). For example, the memory having the string of memory chips can have a dedicated controller separate from the processor chip or SoC configured to provide and control the aforesaid configurations and settings for the memory (e.g., see memory controller chip 302).

For the purposes of this disclosure it is to be understood that a memory chip in the string of memory chips can be replaced by a group of similar memory chips, such that the string includes a string of groups of similar chips (e.g., see string of groups of memory chips 402 shown in FIG. 4). In such examples, each group of similar chips is a node in the string. Also, in some embodiments, the nodes of the string of memory chips can be made up of a combination of single chip nodes and multiple chip nodes (not depicted in the drawings). For example, in the string of memory chips, the first memory chip (e.g., DRAM chip) can be replaced by a group of similar memory chips (e.g., a group of DRAM chips), the second memory chip (e.g., NVRAM chip) can be replaced by a group of similar memory chips (e.g., a group of NVRAM chips), the third memory chip (e.g., flash memory chip) can be replaced by a group of similar memory chips (e.g., a group of flash memory chips), or some combination thereof.

FIG. 5 illustrates example parts of an example computing device 500, in accordance with some embodiments of the present disclosure. The computing device 500 can be communicatively coupled to other computing devices via the computer network 502 as shown in FIG. 5. The computing device 500 includes at least a bus 504, a processor 506 (such as a CPU and/or the processor chip 202 shown in FIG. 2), a main memory 508, a network interface 510, and a data storage system 512. The bus 504 communicatively couples the processor 506, the main memory 508, the network interface 510, and the data storage system 512. The computing device 500 includes a computer system that includes at least processor 506, main memory 508 (e.g., read-only memory (ROM), flash memory, DRAM such as synchronous DRAM (SDRAM) or Rambus DRAM (RDRAM), NVRAM, SRAM, etc.), and data storage system 512, which communicate with each other via bus 504 (which can include multiple buses and wirings).

The main memory 508 can include the memory system 100 depicted in FIG. 1. Also, the main memory 508 can include the memory system 400 depicted in FIG. 4. In some embodiments, the data storage system 512 can include the memory system 100 depicted in FIG. 1. And, the data storage system 512 can include the memory system 400 depicted in FIG. 4.

Processor 506 can represent one or more general-purpose processing devices such as a microprocessor, a central processing unit, or the like. The processor 506 can be or include the processor 202 depicted in FIG. 2. The processor 506 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processor 506 can also be one or more special-purpose processing devices such as an application specific integrated circuit (ASIC), a field programmable gate array (FPGA), a digital signal processor (DSP), network processor, a processor in memory (PIM), or the like. Processor 506 can be configured to execute instructions for performing the operations and steps discussed herein. Processor 506 can further include a network interface device such as network interface 510 to communicate over one or more communications network such as network 502.

The data storage system 512 can include a machine-readable storage medium (also known as a computer-readable medium) on which is stored one or more sets of instructions or software embodying any one or more of the methodologies or functions described herein. The instructions can also reside, completely or at least partially, within the main memory 508 and/or within the processor 506 during execution thereof by the computer system, the main memory 508 and the processor 506 also constituting machine-readable storage media.

While the memory, processor, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Referring back to the memory chip having the data mover, FIG. 6 illustrates an example system 600 that includes a memory chip 602 having an integrated data mover 608, in accordance with some embodiments of the present disclosure. In FIG. 6, the memory chip 602 includes a first set of pins 604 configured to allow the memory chip 602 to be coupled to a first microchip or device 624 via first wiring 634. Also shown, the first microchip or device 624 has a set of pins 605 configured to allow the first microchip or device 624 to be coupled to the memory chip 602 via first wiring 634. The memory chip 602 also includes a second set of pins 606 configured to allow the memory chip 602 to be coupled to a second microchip or device 626 via second wiring 636 that is separate from the first wiring 634. Also shown, the second microchip or device 626 has a set of pins 607 configured to allow the second microchip or device 626 to be coupled to the memory chip 602 via second wiring 636.

The memory chip 602 also includes a data mover 608 configured to facilitate access to the second microchip or device 626, via the second set of pins 606, to read data from the second microchip or device 626 and write data to the second microchip or device 626.

In general, the data mover 608 can combine data stored in the memory chip 602 on its way to the second microchip or device 626 using various strategies. This can improve write performance and endurance of the second microchip or device 626. For example, sequential or block access on memory chips is orders of magnitude faster than random access on memory chips. In some embodiments, data stored in a portion of memory 610 of the memory chip 602 is accessible by or through the first microchip or device 624 via the first set of pins 604. And, in such embodiments, the data mover 608 is configured to combine the data stored in the portion of memory 610 of the memory chip 602 by moving the data in blocks to the second microchip or device 626. Thus, write performance and endurance of the second microchip or device 626 is improved.

Also, in such embodiments and others, the blocks can be at a granularity that is coarser than the data stored in the portion of memory 610 of the memory chip 602. The blocks being at a granularity that is coarser than the pre-blocked data in the memory chip 602, such as the data to be accessed by first microchip or device, can reduce the frequency of data writes to the second microchip or device.

In some embodiments, such as shown in FIG. 6, data stored in a portion of memory 610 of the memory chip 602 can be accessible by or through the first microchip or device 624 via the first set of pins 604. Also, when the data stored in the portion of memory 610 of the memory chip 602 is accessible through the first microchip or device 624 it is being accessed by another memory chip or device or a processor chip or device (which not depicted in FIG. 6 but is shown in FIGS. 2 and 3 to some extent wherein the second memory chip 106 is acting as the memory chip 602). And, the first microchip or device 624 can read data from the memory chip 602 as well as write data to the memory chip 602.

In some embodiments, such as shown in FIG. 6, data stored in a portion of memory 630 of the second microchip or device 626 can be accessible by or through the memory chip 602 via the second set of pins 606. Also, when the data stored in the portion of memory 630 of the second microchip or device 626 is accessible through the memory chip 602 it is being accessed by another memory chip or device or a processor chip or device (such as the first microchip or device 624). And, the memory chip 602 can read data from the second microchip or device 626 as well as write data to the second microchip or device 626.

In some embodiments, such as shown in FIG. 6, the data mover 608 is configured to buffer movement of changes to the data stored in the portion of memory 610 of the memory chip 602. Also, the data mover 608 is configured to send write requests to the second microchip or device 626 in a suitable size due to the buffering by the data mover 608.

When the write to the second microchip or device 626 is in the suitable size due to the buffering by the data mover 608, the second microchip or device can erase a block and program the block in the second microchip or device according to the write without further processing or minimal processing in the second microchip or device. This is one example way that the data mover 608 integrated in the memory chip 602 can improve write performance and endurance of the second microchip or device. Also, with the buffering by the data mover 608 and when frequent and/or random changes are made to the data in a portion of the memory chip 602 (such as the data in the portion of memory 610 accessible by the first microchip or device), the second microchip or device 626 does not have to be frequently erased and reprogrammed in a corresponding way as the changes occurring in the memory chip 602.

The buffering by the data mover 608 is even more beneficial when the second microchip or device 626 is a flash memory chip because the buffering can remove or at least limit the effects of write amplification that occurs in flash memory. Write amplification can be reduced or even eliminated by the buffering because, with the buffering, a write request sent by the memory chip 602 can be modified to a suitable size or granularity expected by the receiving flash memory chip. Thus, the flash memory chip can erase a block and program the block according to the write request without possible duplication of the write and thus avoid further processing in the second microchip or device 626.

Also, the data mover 608 can be configured to bundle changed addresses in the changes to the data stored in the portion of memory 610 of the memory chip 602. And, the data mover 608 can be configured to write bundled changed addresses into another portion of the memory chip 602 to be moved to the second microchip or device 626 via a write request to the second microchip or device 626. The bundling by the data mover 608 can improve the buffering by the data mover and the sending of write requests according to the buffering since the bundling of changed addresses can be controlled by the data mover to correspond to a suitable size or granularity expected by the receiving second microchip or device 626.

In some embodiments, such as shown in FIG. 6, the memory chip 602 includes logical-to-physical mapping 612 for the second microchip or device 626 that is configured to use the bundled changed addresses as input.

FIG. 7 illustrates an example system 700 that includes the memory chip 602 shown in FIG. 6 as well as a microchip or device that receives data transferred from the data mover and has logical-to-physical mapping for mapping the received data (e.g., see logical-to-physical mapping 712), in accordance with some embodiments of the present disclosure. The system 700 is similar to the system 600, except in system 700, the logical-to-physical mapping 712 for the second microchip or device 626 is provided in the second microchip or device 626. This is instead of providing the logical-to-physical mapping for the second microchip or device on the memory chip 602 (e.g., see logical-to-physical mapping 612 depicted in FIG. 6).

With embodiments similar to system 700, the second microchip or device 626 includes logical-to-physical mapping 712 for itself. And, the logical-to-physical mapping 712 is configured to use the bundled changed addresses as input once the bundled changed addresses are sent from the data mover 608 of the memory chip 602 in a write request to the second microchip or device 626. To put it another way, once the bundled changed addresses are received by the second microchip or device 626 from the data mover 608 of the memory chip 602 in a write request to the second microchip or device 626, the logical-to-physical mapping 712 is configured to use the bundled changed addresses as input.

FIG. 8 illustrates an example system 800 that includes the memory chip 602 shown in FIG. 6 which is also shown having encryption and authentication circuitry (e.g., see encryption engine 802 and gatekeeper 804), in accordance with some embodiments of the present disclosure. As shown in FIG. 8, in some embodiments, the memory chip 602 includes an encryption engine 802 configured to secure data to be moved to the second microchip or device 626 for long term storage. Also, as shown, in such embodiments, the memory chip 602 includes a gatekeeper 804, configured to provide an authentication process for access of the secured data stored in the second microchip or device 626. Also, the gatekeeper 804 can be configured to decrypt the secured data according to the authentication process. In some other embodiments, the encryption engine can be hosted on another chip or device instead of being hosted on the memory chip 602.

FIGS. 7 and 8 also depict other components that are illustrated in FIG. 6. For example, FIGS. 7 and 8 depict the memory chip 602 that includes a first set of pins 604 configured to allow the memory chip 602 to be coupled to a first microchip or device 624 via first wiring 634. Also shown in FIGS. 7 and 8, the first microchip or device 624 has a set of pins 605 configured to allow the first microchip or device 624 to be coupled to the memory chip 602 via first wiring 634. Also shown in FIGS. 7 and 8, the memory chip 602 also includes a second set of pins 606 configured to allow the memory chip 602 to be coupled to a second microchip or device 626 via second wiring 636 that is separate from the first wiring 634. Also shown, the second microchip or device 626 has a set of pins 607 configured to allow the second microchip or device 626 to be coupled to the memory chip 602 via second wiring 636. The memory chip 602 also includes a data mover 608 configured to facilitate access to the second microchip or device 626, via the second set of pins 606, to read data from the second microchip or device 626 and write data to the second microchip or device 626.

With respect to the systems shown in FIGS. 6-8, the memory chip 602 can be a NVRAM chip, and with such embodiments, the memory chip 602 includes a plurality of NVRAM cells. The plurality of NVRAM cells in such examples can be or include a plurality of 3D XPoint memory cells. Alternatively, the memory chip 602 can be a dynamic DRAM chip, and with such embodiments, the memory chip 602 includes a plurality of DRAM cells. Also, the memory chip 602 can be a flash memory chip, and with such embodiments, the memory chip 602 includes a plurality of flash memory cells. The plurality of flash memory cells in such embodiments can be or include a plurality of NAND-type flash memory cells.

The second microchip or device 626 can be another memory chip or a memory device. In some embodiments, for example, the second microchip or device 626 is a DRAM chip. In some embodiments, for example, the second microchip or device 626 is a NVRAM chip. In some embodiments, for example, the second microchip or device 626 is a flash memory chip (e.g., a NAND-type flash memory chip).

Some embodiments can include a system having an intermediate memory chip (e.g., see memory chip 602 shown in FIG. 6), a first memory chip (e.g., see first microchip or device 624), and a second memory chip (e.g., see second microchip or device 626). And, in such embodiments, the intermediate memory chip includes a first set of pins (e.g., see first set of pins 604) configured to allow the intermediate memory chip to be coupled to the first memory chip via first wiring (e.g., see wiring 634). The intermediate memory chip can also include a second set of pins (e.g., see second set of pins 606) configured to allow the intermediate memory chip to be coupled to the second memory chip via second wiring (e.g., see wiring 636) that is separate from the first wiring. And, the intermediate memory chip can include a data mover (e.g., see data mover 608) configured to facilitate access to the second memory chip, via the second set of pins, to read data from the second memory chip and write data to the second memory chip.

In such embodiments, the intermediate memory chip can be a NVRAM chip, wherein the NVRAM chip includes a plurality of NVRAM cells. Alternatively, the intermediate memory chip can be a DRAM chip, wherein the DRAM chip includes a plurality of DRAM cells. The plurality of NVRAM cells in such examples can be or include a plurality of 3D XPoint memory cells.

Also, in such embodiments, the second memory chip can be a flash memory chip, wherein the flash memory chip includes a plurality of flash memory cells. The plurality of flash memory cells in such embodiments can be or include a plurality of NAND-type flash memory cells. Alternatively, the second memory chip can be a NVRAM chip, wherein the NVRAM chip includes a plurality of NVRAM cells. The plurality of NVRAM cells in such examples can be or include a plurality of 3D XPoint memory cells. Also, the second memory chip can be a DRAM chip, wherein the DRAM chip includes a plurality of DRAM cells.

Also, in such embodiments, the first memory chip can be a DRAM chip, wherein the DRAM chip includes a plurality of DRAM cells. Alternatively, the first memory chip can be a NVRAM chip, wherein the NVRAM chip includes a plurality of NVRAM cells. The plurality of NVRAM cells in such examples can be or include a plurality of 3D XPoint memory cells.

Some embodiments can include a system having an intermediate memory chip (e.g., see memory chip 602 shown in FIG. 6), a second memory chip (e.g., see second microchip or device 626), and a processor chip, such as a SoC (e.g., see first microchip or device 624). In such embodiments, the intermediate memory chip includes a first set of pins (e.g., see first set of pins 604) configured to allow the intermediate memory chip to be coupled to the processor chip via first wiring (e.g., see wiring 634). Also, the intermediate memory chip can include a second set of pins (e.g., see second set of pins 606) configured to allow the intermediate memory chip to be coupled to the second memory chip via second wiring (e.g., see wiring 636) that is separate from the first wiring. And, the intermediate memory chip can include a data mover (e.g., see data mover 608) configured to facilitate access to the second memory chip, via the second set of pins and the second wiring, to read data from the second memory chip and write data to the second memory chip.

In some embodiments, one or more instances of the memory chip 602 (such as the different instances of the memory chip 602 shown in FIGS. 6-8) can be used as one or more memory chips in flexible provisioning of the string of memory chips 102 shown in FIGS. 1-3. Also, one or more instances of the memory chip 602 can be used as one or more memory chips in flexible provisioning of the string of memory chips 402 shown in FIG. 4.

Also, the system having the intermediate memory chip (e.g., see memory chip 602 shown in FIG. 6), the first memory chip (e.g., see first microchip or device 624), and the second memory chip (e.g., see second microchip or device 626) can be included in the string of memory chips 102 shown in FIGS. 1-3. For example, the memory chip 602 can be or include the second memory chip 106, the first microchip or device 624 can be or include the first memory chip 104 and the second microchip or device 626 can be or include the third memory chip 108.

In some embodiments, the memory chip 602 can be or include the first memory chip 104 in the string of memory chips 102. In such embodiments, for example, the first microchip or device 624 can be or include the processor chip 202 shown in FIG. 2 or the memory controller chip 302 shown in FIG. 3. Also, in such embodiments, the second microchip or device 626 can be or include the second memory chip 106 in the string of memory chips 102.

In some embodiments, any one or more of the systems 600, 700, and 800 can be included in the main memory 508 and/or the data storage system 512 shown in FIG. 5. In such embodiments and others, the first microchip or device 624 can be, be a part of, or include the processor 506.

Like the memory chip 602, any other of the memory chips described herein (e.g., see memory chips 104, 106, and 108) can include an encryption engine and/or an authentication gatekeeper for securing data moved to or through the memory chip (e.g., see encryption engine 802 and gatekeeper 804 shown in FIG. 8). Also, like the memory chip 602, any other of the memory chips described herein (e.g., see memory chips 104, 106, and 108) can include a data mover, such as the data mover 608.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory system, comprising:
a string of memory chips having at least two memory chips, wherein:
a first memory chip of the string of memory chips comprising:
a first set of pins configured to couple the first memory chip to a microchip via first wiring;
a second set of pins configured to couple the first memory chip to a second memory chip of the string of memory chips via second wiring that is separate from the first wiring;
a data mover configured to facilitate access to the second memory chip, via the second set of pins, to read data from the second memory chip and write data to the second memory chip; and
an encryption engine configured to encrypt data to be moved to the second memory chip;
the second memory chip comprising:
a third set of pins configured to couple the second memory chip to the first memory chip via the second wiring; and
a fourth set of pins configured to couple the second memory chip to a third memory chip of the string of memory chips via third wiring that is separate from the first wiring and the second wiring.

2. The memory system of claim 1, wherein data stored in a portion of the first memory chip is accessible by or through the microchip via the first set of pins.

3. The memory system of claim 2, wherein the data mover is configured to combine the data stored in the portion of the first memory chip by moving the data in blocks to the second memory chip.

4. The memory system of claim 3, wherein the blocks are at a granularity that is coarser than the data stored in the portion of the first memory chip.

5. The memory system of claim 4, wherein the data mover is configured to:

buffer movement of changes to the data stored in the portion of the first memory chip; and
send write requests to the second memory chip in a suitable size due to the buffering by the data mover.

6. The memory system of claim 5, wherein the data mover is configured to:
bundle changed addresses in the changes to the data stored in the portion of the first memory chip; and
write bundled changed addresses into another portion of the first memory chip to be moved to the second memory chip via a write request to the second memory chip.

7. The memory system of claim 5, comprising logical-to-physical mapping for the second memory chip that is configured to use the bundled changed addresses as input.

8. The memory system of claim 5, wherein the second memory chip comprises logical-to-physical mapping for itself that is configured to use the bundled changed addresses as input once the bundled changed addresses are sent in a write request to the second memory chip.

9. The memory system of claim 1, wherein the first memory chip is a non-volatile random-access memory (NVRAM) chip, and wherein the first memory chip comprises a plurality of NVRAM cells.

10. The memory system of claim 9, wherein the plurality of NVRAM cells is a plurality of 3D XPoint memory cells.

11. The memory system of claim 1, wherein the first memory chip is a dynamic random-access memory (DRAM) chip, and wherein the first memory chip comprises a plurality of DRAM cells.

12. The memory system of claim 1, wherein the first memory chip is a flash memory chip, and wherein the first memory chip comprises a plurality of flash memory cells.

13. The memory system of claim 12, wherein the plurality of flash memory cells is a plurality of NAND-type flash memory cells.

14. The memory system of claim 1, comprising a gatekeeper, configured to:
provide an authentication process for access of a secured data stored in the second memory chip; and
decrypt the secured data according to the authentication process.

15. The memory system of claim 1, wherein the data mover is a first data mover, and further wherein the second memory chip comprises a second data mover configured to facilitate access to the third memory chip, via the fourth set of pins, to read data from the third memory chip and write data to the third memory chip.

16. A system, comprising:
a first memory chip;
a second memory chip, and
an intermediate memory chip comprising:
a first set of pins configured to couple the intermediate memory chip to the first memory chip via first wiring;
a second set of pins configured to couple the intermediate memory chip to the second memory chip via second wiring that is separate from the first wiring;
a data mover configured to facilitate access to the second memory chip, via the second set of pins, to read data from the second memory chip and write data to the second memory chip; and
an encryption engine configured to encrypt data to be moved to the second memory chip.

17. The system of claim 16, wherein the intermediate memory chip is a non-volatile random-access memory (NVRAM) chip, and wherein the NVRAM chip comprises a plurality of NVRAM cells.

18. The system of claim 17, wherein the second memory chip is a flash memory chip, and wherein the flash memory chip comprises a plurality of flash memory cells.

19. The system of claim 17, wherein the first memory chip is a dynamic random-access memory (DRAM) chip, and wherein the DRAM chip comprises a plurality of DRAM cells.

20. A system, comprising:
processor;
a first memory;
a second memory; and
an intermediate memory comprising:
- a first set of pins configured to couple the intermediate memory to the processor via first wiring;
- a second set of pins configured to couple the intermediate memory to the first memory via second wiring that is separate from the first wiring; and
- a data mover configured to facilitate access to the first memory, via the second set of pins and the second wiring, to read data from the first memory and write data to the first memory; and
- an encryption engine configured to encrypt data to be moved to the first memory;

wherein:
- a third set of pins of the first memory configured to couple the first memory to the intermediate memory via the second wiring; and
- a fourth set of pins of the first memory configured to couple the first memory to the second memory via third wiring that is separate from the first wiring and the second wiring.

* * * * *